(12) United States Patent
Grouchko et al.

(10) Patent No.: US 10,590,295 B2
(45) Date of Patent: Mar. 17, 2020

(54) INKS CONTAINING METAL PRECURSORS NANOPARTICLES

(71) Applicant: SINGAPORE ASAHI CHEMICAL & SOLDER IND. PTE. LTD, Singapore (SG)

(72) Inventors: Michael Grouchko, Jerusalem (IL); Shlomo Magdassi, Jerusalem (IL)

(73) Assignee: Singapore Asahi Chemical & Solder Ind. Pte. Ltd, Singapore (SG)

(*) Notice: Subject to any disclaimer, the term of this patent is extended or adjusted under 35 U.S.C. 154(b) by 164 days.

(21) Appl. No.: 14/382,110

(22) PCT Filed: Feb. 28, 2013

(86) PCT No.: PCT/IL2013/050173
§ 371 (c)(1),
(2) Date: Aug. 29, 2014

(87) PCT Pub. No.: WO2013/128449
PCT Pub. Date: Sep. 6, 2013

(65) Prior Publication Data
US 2015/0056426 A1 Feb. 26, 2015

Related U.S. Application Data

(60) Provisional application No. 61/604,605, filed on Feb. 29, 2012.

(51) Int. Cl.
*C09D 11/52* (2014.01)
*H01B 13/00* (2006.01)
(Continued)

(52) U.S. Cl.
CPC ............. *C09D 11/52* (2013.01); *C08K 5/098* (2013.01); *H01B 13/003* (2013.01);
(Continued)

(58) Field of Classification Search
CPC ........ C09D 11/30; C09D 11/52; C08K 5/098; H01B 13/0026; H01B 13/003; H01B 13/0016
See application file for complete search history.

(56) References Cited

U.S. PATENT DOCUMENTS 5,814,248 A 9/1998 Tani et al.
6,830,778 B1 12/2004 Schulz et al.
(Continued)

FOREIGN PATENT DOCUMENTS

CN 101316902 A 12/2008
CN 101511952 A 8/2009
(Continued)

OTHER PUBLICATIONS

Magdassi et al., "Copper Nanoparticles for Printed Electronics: Routes Towards Achieving Oxidation Stability," Materials, 2010, vol. 3, pp. 4626-4638.
(Continued)

*Primary Examiner* — Scott R. Walshon
*Assistant Examiner* — Sathavaram I Reddy
(74) *Attorney, Agent, or Firm* — Vorys, Sater, Seymour and Pease LLP; Anthony Venturino (57) ABSTRACT

Provided are novel ink formulations based on metal salts and metal complexes. The formulations include a sole metal precursor in the form of metal salt nanoparticles dispersed in a medium. In addition, the metal salt nanoparticles may include an anion. The novel ink formulations may be used for producing conducting patterns.

20 Claims, 2 Drawing Sheets

(51) Int. Cl.
*C08K 5/098* (2006.01)
*H05K 1/09* (2006.01)

(52) U.S. Cl.
CPC ..... *H01B 13/0016* (2013.01); *H01B 13/0026* (2013.01); *H05K 1/097* (2013.01); H05K 2203/1131 (2013.01); Y10T 428/24909 (2015.01)

(56) References Cited

U.S. PATENT DOCUMENTS

| | | | | |
|---|---|---|---|---|
| 7,691,294 | B2 * | 4/2010 | Chung | C09D 5/24 242/159 |
| 7,977,240 | B1 * | 7/2011 | Rockenberger | C09D 11/52 257/E21.273 |
| 8,282,860 | B2 | 10/2012 | Chung et al. | |
| 8,486,306 | B2 | 7/2013 | Kamikoriyama et al. | |
| 8,766,251 | B2 | 7/2014 | Kuegler et al. | |
| 2002/0058141 | A1 | 5/2002 | Hareyama | |
| 2003/0161959 | A1 * | 8/2003 | Kodas | C09D 11/30 427/376.2 |
| 2003/0180451 | A1 | 9/2003 | Kodas et al. | |
| 2005/0238804 | A1 * | 10/2005 | Garbar | C23C 4/123 427/180 |
| 2006/0189113 | A1 * | 8/2006 | Vanheusden | B22F 1/0018 438/597 |
| 2008/0003364 | A1 | 1/2008 | Ginley et al. | |
| 2008/0083299 | A1 * | 4/2008 | Simone | B22F 9/24 75/345 |
| 2008/0134936 | A1 * | 6/2008 | Kamikoriyama | C09D 11/52 106/31.92 |
| 2009/0033223 | A1 | 2/2009 | Terada et al. | |
| 2011/0111138 | A1 * | 5/2011 | McCullough | C07F 1/005 427/595 |
| 2011/0135823 | A1 | 6/2011 | Lee et al. | |
| 2014/0065387 | A1 * | 3/2014 | Andre | C09D 11/03 428/209 |

FOREIGN PATENT DOCUMENTS

| | | |
|---|---|---|
| CN | 102272094 A | 12/2011 |
| EP | 1 847 575 A1 | 10/2007 |
| EP | 2 468 827 A1 | 6/2012 |
| EP | 2 608 218 A1 | 6/2013 |
| JP | 2008-13466 A | 1/2008 |
| KR | 2009/0015634 A | 2/2009 |
| WO | 2006/093398 A1 | 9/2006 |
| WO | 2010/036113 A1 | 4/2010 |
| WO | 2011/057218 A2 | 5/2011 |
| WO | 2011/079329 A2 | 7/2011 |
| WO | 2013/077499 A1 | 5/2013 |

OTHER PUBLICATIONS

Woo et al., "Effect of Carboxylic Acid on Sintering of Inkjet-Printed Copper Nanoparticulate Films," ACS Applied Materials & Interfaces, 2011, vol. 3, pp. 2377-2382.

Jeong et al., "Stable Aqueous Based Cu Nanoparticle Ink for Printed Well-Defined Highly Conductive Features on a Plastic Substrate," Langmuir, 2011, vol. 27, pp. 3144-3149.

Lee et al., "Effect of Complex Agent on Characteristics of Copper Conductive Pattern Formed by Ink-jet Printed," Japanese Journal of Applied Physics, 2010, vol. 49, pp. 086501-1-086501-4.

Kim et al., "Effect of copper concentration in printable copper inks on film fabrication," Thin Solid Films, 2012, vol. 520, pp. 2731-2734.

Choi et al., "Highly conductive polymer-decorated Cu electrode films printed on glass substrates with novel precursor-based inks and pastes," Journal of Materials Chemistry, 2012, vol. 22, pp. 3624-3631.

Joo et al., "Comparative studies on thermal and laser sintering for highly conductive Cu films printable on plastic substrate," Thiin Solid Films, 2012, vol. 520, pp. 2878-2883.

Yabuki et al., "Low-temperature sythesis of copper conductive film by thermal decomposition of copper-amine complexes," Thin Solid Films, 2011, vol. 519, pp. 6530-6533.

Reinhard Vehring, "Pharmaceutical Particle Engineering via Spray Drying," Pharmaceutical Research, 2008, vol. 25, No. 5, pp. 999-1022.

* cited by examiner

INKS CONTAINING METAL PRECURSORS NANOPARTICLES

TECHNOLOGICAL FIELD

The present invention is generally directed to novel ink formulations and uses thereof for producing conducting patterns.

BACKGROUND

In recent years, the synthesis of copper (Cu) nanoparticles has become of great importance from a scientific point of view as well as from an industrial point of view; due to its huge potential for replacing expensive nano-silver-based inks. Since the 1990s, many attempts have been made to synthesize nano-copper by wet chemistry processes, as well as by gas or solid phase methods. Among these are the sonochemical method, microemulsion techniques, polyol processes, radiation methods, thermal reduction, reducing flame synthesis, metal vapor synthesis, vacuum vapor deposition and chemical reduction in solution[1-3].

Copper NPs can be mainly used in ink formulations for printing conductive patterns. Copper NPs based inks suffer from two main disadvantages: poor resistance to oxidation and high sintering temperatures. Therefore, sintering of copper NPs is typically carried out under special conditions and atmospheres, such as $N_2$, $H_2$, carboxylic acid vapors and others, and heating to high temperatures which prevent the use of low cost plastic substrates which are temperature sensitive. To date, copper NPs based inks have been sintered at temperatures above 150° C.

Recently, several reports were published on the use of copper complexes as conductive inks [4-9].

Lee et al. [4] reported on water based ink-jet inks based on a copper ion complex for use in printing conductive patterns. These inks consisted of ammonia water soluble Cu-formate or Cu-citrate complexes which are synthesized by electrolysis. Copper electrode patterns made of these ammonia complexes were obtained only after sintering the printed patterns at 250° C. for 60 minutes under hydrogen atmosphere.

Kim et al. [5] reported on a copper-complex ink, formed by mixing copper formate and hexylamine while the hexylamine served both as a complexing agent and as a solvent. The obtained layer was sintered under nitrogen flow with formic acid vapors. Choi et al. [6] have further developed a composition for use as a screen-printing paste which can be sintered under similar conditions (nitrogen followed by a reducing atmosphere).

Yabuki et al. [8] reported on a solvent ink composed of complexes of copper formate tetrahydrate and n-octyl amine dissolved in toluene. The copper electrodes were formed by calcining the printed inks thermally on glass substrates at a temperature range of between 110 and 140° C. under nitrogen atmosphere.

Chung et al. [9] reported the formation of various complex-based conductive inks (based on silver, copper and other metals), that can be formulated by forming complexes with ammonium carbamate and ammonium carbonate. These complexes were further formulated with copper or silver flakes and sintered under nitrogen to give low sheet resistance.

REFERENCES

[1] Magdassi et al. *Materials,* 2010, 3, 4626-4638,
[2] Woo et al. *ACS Applied Materials & Interfaces,* 2011, 3(7), 2377-2382,
[3] Jeong et al. *Langmuir,* 2011, 27(6), 3144-3149,
[4] Lee et al *Jpn. J. Appl. Phys.,* 49 (2010) 086501,
[5] Kim et al. *Thin solid films,* 520 (2012), 2731-2734,
[6] Choi et al *J. Mater. Chem.,* 22 (2012), 3624,
[7] Joo et al. *Thin Solid Films,* 520 (2012), 2878-2883,
[8] Yabuki et al *Thin Solid Films,* 519 (2011), 6530-6533,
[9] WO 2006/093398

SUMMARY OF THE INVENTION

Printed electronics have become a major technology in the electronic industry, as it provides the ability to precisely write electronic components and circuits, at low cost and ease of production.

However, the printed electronics technology requires integration and optimization of many factors from the printing formulation (ink) and the substrate to the printed pattern. As known in the field, one of the drawbacks associated with the production of ink formulations, which are based on metal complexes solubilized in organic solvents is the necessity to utilize high amount of complexing agents (organic ligand).

Similarly, metal-based ink formulations are prone to oxidation and are therefore relatively unstable.

Thus, it is an object of the invention to provide a novel stable printing formulation for printed electronics, the formulation comprising stable, oxidation-resistant metal precursors.

Another objective of the invention is to provide a process for producing, on a variety of substrates, particularly on heat sensitive substrates, conductive patterns utilizing metal precursors.

A further objective is to provide a conductive pattern on heat sensitive substrates.

Thus, in one aspect, the invention provides a printing formulation (i.e., ink formulation) comprising at least one metal precursor selected from:
  (1) metal precursor in the form of metal salt nanoparticles dispersed in a medium, and
  (2) metal precursor in the form of a metal complex, as defined herein, dissolved in a medium.

The medium of metal precursor (1) may or may not be identical to the medium of metal precursor (2). In some embodiments, the medium of either option is a medium suitable for ink formulations, namely a printing suitable liquid carrier.

As used herein, the "metal precursor" is a chemical material which comprises the metal atom in a charged form and which upon treatment gives rise to the metallic form of the same metal. In accordance with the present invention, the metal precursor may be in the form of a metal salt or a metal complex, in either case the metal atom is in a non-zero oxidation state and is transferable to the zero-oxidation state by further treatment. For example, a copper metal precursor may be copper formate, which upon decomposition under the process of the invention affords the metal copper)($Co^0$).

In some embodiments, the metal precursor is a metal cyanate, metal carbonate, metal nitrate, metal sulfate, metal phosphate, metal thiocyanate, metal chlorate, metal perchlorate, metal acetylacetonate, metal carboxylate and metal tetrafluoroborate, as further exemplified hereinbelow.

In some embodiments, the printing formulation comprises a printing suitable medium and a combination of:

(1) metal precursor in the form of metal salt nanoparticles dispersed in said medium (as detailed hereinbelow); and (2) metal precursor in the form of a metal complex, as defined herein, dissolved in said medium.

In some embodiments, the printing formulation comprises (as the sole metal precursor) at least one metal precursor in the form of metal salt nanoparticles.

The "metal salt" refers to the cation form of the metallic element which patterning on the surface of a substrate is intended in accordance with the invention. For example, a copper salt refers to a copper cation associated with one or more organic and/or inorganic anions. The metal salt is typically in the form of nanoparticles, namely in the form of a particulate material having at least one dimension at the nano-scale, namely the mean particle size is less than 1,000 nm.

In some embodiments, the mean particle size is between about 10 nm and 1,000 nm. In other embodiments, the mean particle size is between about 50 nm and 1,000 nm.

In some embodiments, the mean particle size is less than 500 nm. In other embodiments, the mean particle size is between about 50 nm and 500 nm.

In some embodiments, the mean particle size is less than 100 nm. In other embodiments, the mean particle size is between about 10 nm and 100 nm.

In some embodiments, the mean particle size is less than 50 nm. In other embodiments, the mean particle size is between about 10 nm and 50 nm.

The metal salt nanoparticles may have any shape or contour, including spherical and non-spherical shapes (e.g., polyhedral or elongated shape). In some embodiments, the nanoparticles have random shapes, or are substantially spherical. In additional embodiments, the nanoparticles may be amorphous or crystalline.

The nanoparticulate metal salt is typically obtained by milling the metal salt material to particulates of a desired size. In some embodiments, milling is achieved by bead milling.

Figure 1:
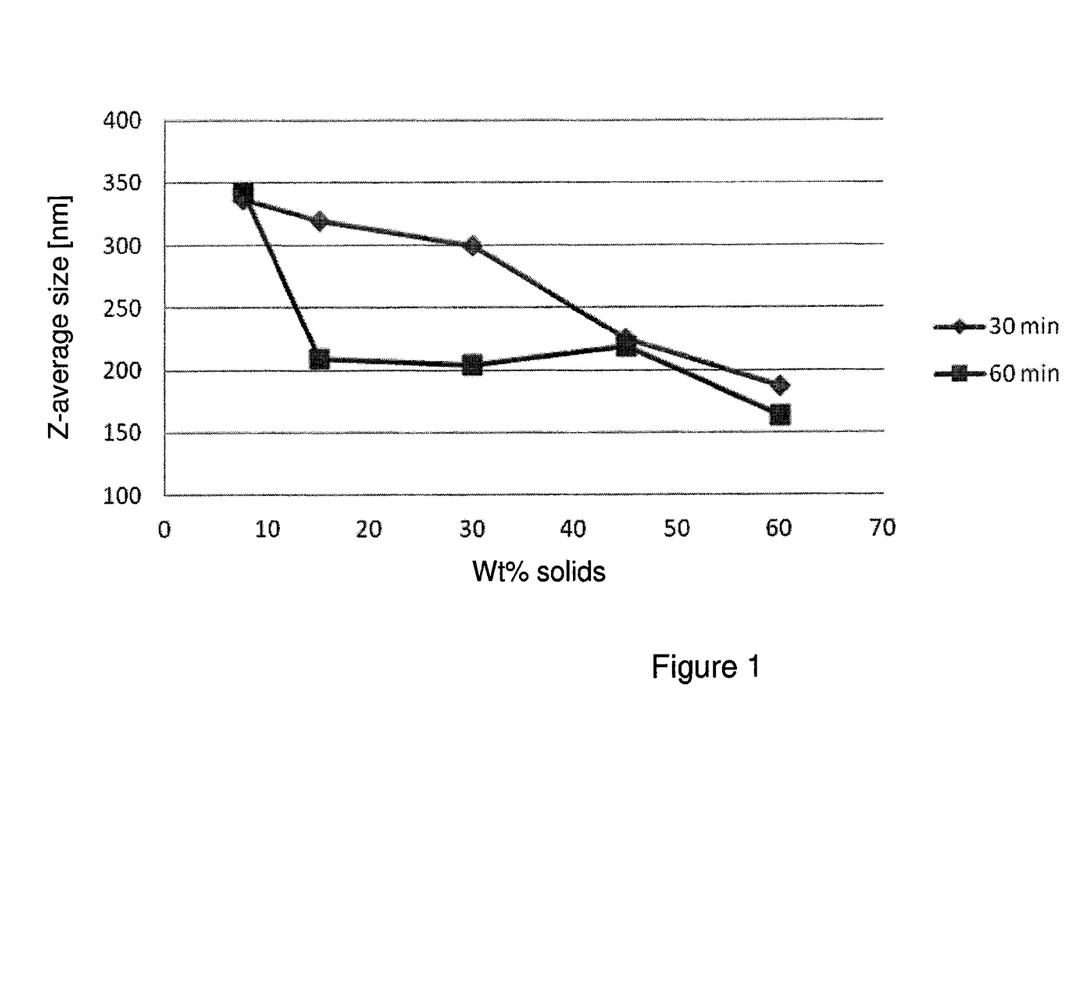
FIG. 1 demonstrates the effect of solid loading (copper formate wt %) on the particle size at a constant stabilizer-to-solid ratio. The upper line describes the effect for 30 min milling and the bottom line for 60 min of milling

In some embodiments, bead milling is performed by milling a mixture of the metal salt, a stabilizer and a solvent at the presence of beads. The obtained particles may be at the micron range or at the submicron range. The obtained particle size depends strongly on the milling parameters (bead size, duration, rpm and other parameters), the solid loading, the stabilizer and the solvent. For example, FIG. 1 depicts the effect of the solid loading (copper formate) on the obtained particle size at a constant stabilizer to solid ratio.

Alternatively, the metal salt particles may be formed by spray drying a solution (see for example *Pharmaceutical Research*, 2007, 25(5), 999-1022).

Precipitation may also be used to produce the metal salt particles, as defined. In such a method, a proper precipitation agent is added to a solution of the precursor material which is allowed to precipitate out. For example, copper formate may be precipitated by addition of formic acid to a copper carbonate solution or dispersion. The copper formate particles precipitate due to their insolubility in the medium. The precipitation process may be performed in the presence of a stabilizer, to control the nucleation and growth of the copper formate particles and to obtain dispersed particles. More specifically, in the case of copper formate particles, the process can be carried out by mixing copper carbonate (or copper acetate) in a proper solvent and thereafter adding formic acid to form copper formate particles, while $CO_2$ (or acetic acid) is released. The same precipitation process can take place by contacting double jets containing the soluble or insoluble copper salt and formic acid. Precipitation can also take place by dissolving the copper formate or complexes thereof in a solvent, followed by adding a solvent which does not dissolve copper format.

Generally, the metal salt is of a metallic element of Groups IIIB, IVB, VB, VIB, VIIB, VIIIB, IB, IIB, IIIA, IVA and VA of block d of the Periodic Table of the Elements.

In other embodiments, the metal is a transition metal of Groups IIIB, IVB, VB, VIB, VIIB, VIIIB, IB and IIB of block d the Periodic Table. In some embodiments, the transition metal is a metallic element selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os and Ir.

In some embodiments, the metal is selected from Cu, Ni, Ag, Au, Pt, Pd, Al, Fe, Co, Ti, Zn, In, Sn and Ga.

In some embodiments, the metal is selected from Cu, Ni and Ag.

In some embodiments, the metal is Cu.

The inorganic or organic anion may be any negatively charged atom or groups of atoms (e.g., in the form of ligands), which may be singly charged or multi-charged (with a charge of −2 or higher).

In some embodiments, the anion is inorganic. Non-limiting examples of inorganic anions include $HO^-$, $F^-$, $Cl^-$, $Br^-$, $I^-$, $NO_2^-$, $NO_3^-$, $ClO_4^-$, $SO_4^{-2}$, $SO_3^-$, $PO_4^-$ and $CO_3^{-2}$.

In some embodiments, the anion is organic. Non-limiting examples of organic anions include acetate ($CH_3COO^-$), formate ($HCOO^-$), citrate ($C_3H_5O(COO)_3^{-3}$), acetylacetonate, lactate ($CH_3CH(OH)COO^-$), oxalate (($COO)_2^{-2}$) and any derivative of the aforementioned.

In some embodiments, the metal salt is not a metal oxide.

In some embodiments, the metal salt is a salt of copper. Non limiting examples of copper metal salts include copper formate, copper citrate, copper acetate, copper nitrate, copper acetylacetonate, copper perchlorate, copper chloride, copper sulfate, copper carbonate, copper hydroxide, copper sulfide or any other copper salt and the mixtures thereof.

In some embodiments, the metal salt is a salt of nickel. Non-limiting examples of nickel metal salts include nickel formate, nickel citrate, nickel acetate, nickel nitrate, nickel acetylacetonate, nickel perchlorate, nickel chloride, nickel sulfate, nickel carbonate, nickel hydroxide or any other nickel salts and the mixtures thereof.

In some embodiments, the metal salt is a salt of silver. Non-limiting examples of silver metal salts include silver oxalate, silver lactate, silver formate or any other silver salt and their mixtures.

In other embodiments, the metal salt is selected from indium(III) acetate, indium(III) chloride, indium(III) nitrate; iron(II) chloride, iron(III) chloride, iron(II) acetate; gallium (III) acetylacetonate, gallium(II) chloride, gallium(III) chloride, gallium(III) nitrate; aluminum(III) chloride, aluminum (III) stearate; silver nitrate, silver chloride; dimethylzinc, diethylzinc, zinc chloride, tin(II) chloride, tin(IV) chloride, tin(II) acetylacetonate, tin(II) acetate; lead(II) acetate, lead (II) acetylacetonate, lead(II) chloride, lead(II) nitrate and PbS.

The nanoparticulate metal salt material is formulated as a dispersion printing or ink formulation, in a liquid medium in which the material is substantially insoluble. The medium may be an aqueous or non-aqueous (organic) liquid medium.

In some embodiments, the medium is water or a water-containing liquid mixture.

In further embodiments, the medium is a water-containing liquid mixture, also containing an organic solvent.

In other embodiments, the medium may be an organic solvent or a medium containing an organic solvent.

In some embodiments, the organic solvent is selected from alcohols, glycols, glycol ethers, acetates, ethers, ketones, amides and hydrocarbons.

In some embodiments, the medium is selected from dipropyleneglycol methyl ether (DPM), 2-methoxyethyl ether (diglyme), triethyleneglycol dimethyl ether (triglyme), propylene glycol, sulfolane, polyethylene glycol and glycerol.

In some embodiments, the organic solvent is selected amongst glycol ethers. In some embodiments, the glycol ether is selected from Dowanol™ DB, Dowanol™ PM glycol ether, Dowanol™ DPM, Dowanol™ DPM glycol ether, Dowanol™ DPMA glycol ether, Dowanol™ TPM glycol ether, Dowanol™ TPM-H GE, Dowanol™ PMA, Dowanol™ DPMA, Dowanol™ PnP glycol ether, Dowanol™ DPnP glycol ether, Dowanol™ PnB glycol ether, Dowanol™ DPnB glycol ether, Dowanol™ TPnB glycol ether, Dowanol™ PPh glycol ether, Dowanol™ PGDA, Dowanol™ DMM, Dowanol™ EPh glycol ether, and any other glycol ether. In the above list, Dowanol™ are DOW Chemical Co. hydrophobic/hydrophilic glycol ethers.

In other embodiments, the solvent is an alcohol selected from methanol, ethanol, propanol, butanol and other alcohols. In further embodiments, the solvent may be acetate such as ethyl acetate, ethylaceto acetate, and others.

In other embodiments, the solvent is selected from diethyl ether, acetone, ethyl acetate, ethanol, propanol, butanol, and any combination thereof.

The metal salt particles may be stabilized by one or more stabilizers (dispersing agents, dispersants) to prevent aggregation and/or agglomeration of the particles and to enable a stable dispersion. Such materials may be a surfactant and/or a polymer. The stabilizer may have ionic or non-ionic functional groups, or a block co-polymer containing both. It may also be a volatile stabilizer which evaporates during the decomposition of the metal salt; thus enabling higher conductivities after the decomposition and sintering of the pattern. That stabilizer may additionally be selected to have the ability of forming a complex with the metal.

In some embodiments, the stabilizing agent is the dispersion medium itself.

The dispersing agent may be selected amongst polyelectrolytes or polymeric materials. Representative examples of such dispersants include without limitation polycarboxylic acid esters, unsaturated polyamides, polycarboxylic acids, polycarboxylate, alkyl amine salts of polycarboxylic acids, polyacrylate dispersants, polyethyleneimine dispersants, polyethylene oxide, and polyurethane dispersants and co-polymers of these polymers.

In some embodiments, the dispersant is selected without limitation from:
Disperse BYK® 190, Disperse BYK® 161, Disperse BYK® 180, Disperse BYK® 9076, Disperse BYK® 163, Disperse BYK® 164, Disperse BYK® 2000 and Disperse BYK® 2001, all of which being available from BYK;
EFKA® 4046 and EFKA® 4047, available from EFKA;
Solsperse® 40000, Solsperse® 39000 and Solsperse® 24000 available from Lubrizol; and
XP 1742 available from Coatex.

In further embodiments, the dispersant is a surfactant, which may or may not be ionic. In some embodiments, the surfactant is cationic or anionic. In further embodiments, said surfactant is non-ionic or zwitterionic. Non-limiting examples of such cationic surfactants include didodecyldimethylammonium bromide (DDAB), CTAB, CTAC, cetyl (hydroxyethyl)(dimethyl)ammonium bromide, N,N-dimethyl-N-cetyl-N-(2-hydroxyethyl)ammonium chloride, anionic surfactants such as sodium dodecyl sulfate (SDS) and various unsaturated long-chain carboxylates, zwitterionic phospholipids, such as 1,2-bis(10,12-tricosadiynoyl)-sn-glycero-3-phosphochline, water-soluble phosphine surfactants, such as sodium salts of sulfonated triphenylphosphine, $P(m-C_6H_4SO_3Na)_3$ and alkyltriphenylmethyltrisulfonate, $RC(p-C_6H_4SO_3Na)_3$, alkyl polyglycol ethers, e.g., ethoxylation products of lauryl, tridecyl, oleyl, and stearyl alcohols; alkyl phenol polyglycol ethers, e.g., ethoxylation products of octyl or nonylphenol, diisopropyl phenol, triisopropyl phenol; alkali metal or ammonium salts of alkyl, aryl or alkylaryl sulfonates, sulfates, phosphates, and the like, including sodium lauryl sulfate, sodium octylphenol glycolether sulfate, sodium dodecylbenzene sulfonate, sodium lauryldiglycol sulfate, and ammonium tri-tert-butyl phenol and penta and octa-glycol sulfonates; sulfosuccinate salts, e.g., disodium ethoxylated nonylphenol ester of sulfosuccinic acid, disodium n-octyldecyl sulfosuccinate, sodium dioctyl sulfosuccinate, and the like.

In some embodiments, the stabilizing agent is a cationic polymer.

In some embodiments, the metal precursor is copper formate, the solvent being glycol ether and the stabilizer being a functionalized polymer. In some embodiments, the stabilizing agent is a copolymer or salt of a copolymer having acidic groups.

The printing formulation may further comprise an additive selected from humectants, binders, surfactants, fungicides, rheology modifiers, pH adjusting agents, wetting agents and mixtures thereof.

As stated above, the printing formulation (i.e., ink formulation) comprises at least one metal precursor selected from:
(1) metal precursor in the form of metal salt nanoparticles dispersed in a medium (as detailed hereinabove); and
(2) metal precursor in the form of a metal complex, as defined herein, dissolved in a medium.

Thus, in some embodiments, the printing formulation comprises (as the sole metal precursor) a metal precursor in the form of a metal complex, in a liquid medium in which the metal complex is soluble.

As used herein, the metal complex comprises the metal atom and one, two, three or more "complexing moieties" or chelating moieties. The number of complexing moieties may vary depending inter alia in the metal atom, its charge, the nature of the moiety and the stability of the metal complex. In some embodiments, the moieties are organic moieties. In some embodiments, the complexing moieties are amino acids.

In other embodiments, the complexing moieties are one or more of amine complexing group (e.g., —$NH_2$, —NHR, —NRR, or an ammonium equivalent of any of the aforementioned, and others, wherein each R is independently an organic moiety) and an hydroxyl complexing group (—OH) which may or may not be an end or pendant group on an organic moiety.

In some embodiments, the metal is copper and the copper complex is selected to easily decompose at a low temperature to enable sintering on a heat sensitive substrate such as a plastic substrate (around 150° C.).

In some embodiments, the copper complex comprises amine and hydroxy complexing groups. The combination of these two complexing moieties enables the formation of copper complexes at a ratio of ~1, i.e., with much less organic content as compared to amine complexing moieties only, and at least 50% organic content less than the complexes cited in the aforementioned prior art.

In some embodiments, the complexing moieties, having hydroxy amine moieties (namely: moieties having both the amine and the hydroxyl functionalities), are selected from ethanol amine, di-ethanol amine, triethanol amine, amino methyl propanol (AMP 95), 1-amino-2-propanol, 3-amino-1-propanol, di-isopropanolamine and other complexing agents containing the two functional complexing groups.

In some embodiments, the complexing moiety is amino methyl propanol (AMP).

The ratio between the hydroxyl and the amine moieties is about 1:1 as in AMP, 1:2 as in di-ethanol amine, 2:1 as in ethanol diamine, or any other ratio.

The advantages of metal complex precursors according to the present disclosure over complexes reported in the art are:
1. The metal complexes decompose at a relatively low temperature; thus enabling conversion of the metal precursor to metal even on sensitive plastic substrate.
2. The metal complexes decompose to yield a metallic pattern under nitrogen atmosphere, without needing to utilize a reducing atmosphere.
3. The metal complexes are soluble and therefore do not present aggregation and precipitation challenges.
4. The formulations containing the metal complexes are jettable by, e.g., ink-jet printing technologies to form conductive patterns, without causing print-head clogging problems.
5. The metal complexes afford patterns of higher conductivities due to lower organic content and lower energy requirement for removal of fewer complexing agents.

Generally, the metal complex is of a metallic element of Groups MB, IVB, VB, VIB, VIIB, VIIIB, IB, IIB, IIIA, IVA and VA of block d of the Periodic Table of the Elements.

In other embodiments, the metal is a transition metal of Groups MB, IVB, VB, VIB, VIIB, VIIIB, IB and IIB of block d the Periodic Table. In some embodiments, the transition metal is a metallic element selected from Sc, Ti, V, Cr, Mn, Fe, Ni, Cu, Zn, Y, Zr, Nb, Tc, Ru, Mo, Rh, W, Au, Pt, Pd, Ag, Mn, Co, Cd, Hf, Ta, Re, Os and Ir.

In some embodiments, the metal is selected from Cu, Ni, Ag, Au, Pt, Pd, Al, Fe, Co, Ti, Zn, In, Sn and Ga.

In some embodiments, the metal is Cu, Ni, Al, Co, Ag and Zn.

In some embodiments, the metal is selected from Cu, Ni and Ag.

In some embodiments, the metal is Cu.

In some embodiments, the metal in the metal complex is selected from Cu, Ni, Al, Co, Ag and Zn and the complexing moieties are selected from ethanol amine, di-ethanol amine, triethanol amine, amino methyl propanol (AMP 95), 1-amino-2-propanol, 3-amino-1-propanol, di-isopropanolamine and other complexing agents containing the two functional complexing groups.

In some embodiments, the metal in the metal complex is Cu and the complexing moieties are selected from ethanol amine, di-ethanol amine, triethanol amine, amino methyl propanol (AMP 95), 1-amino-2-propanol, 3-amino-1-propanol, di-isopropanolamine and other complexing agents containing the two functional complexing groups.

In some embodiments, the medium in which the metal complexes are dissolved is water or a water-containing liquid mixture.

In further embodiments, the medium is a water-containing liquid mixture, also containing an organic solvent.

In other embodiments, the medium may be an organic solvent or a medium containing an organic solvent.

In some embodiments, the medium is selected from dipropyleneglycol methyl ether (DPM), 2-methoxyethyl ether (diglyme), triethyleneglycol dimethyl ether (triglyme), propylene glycol, sulfolane, polyethylene glycol and glycerol.

In some embodiments, the medium is an organic solvent selected amongst glycol ethers. In some embodiments, the glycol ether is selected from Dowanol™ DB, Dowanol™ PM glycol ether, Dowanol™ DPM, Dowanol™ DPM glycol ether, Dowanol™ DPMA glycol ether, Dowanol™ TPM glycol ether, Dowanol™ TPM-H GE, Dowanol™ PMA, Dowanol™ DPMA, Dowanol™ PnP glycol ether, Dowanol™ DPnP glycol ether, Dowanol™ PnB glycol ether, Dowanol™ DPnB glycol ether, Dowanol™ TPnB glycol ether, Dowanol™ PPh glycol ether, Dowanol™ PGDA, Dowanol™ DMM, Dowanol™ EPh glycol ether, and any other glycol ether. In the above list, Dowanol™ are DOW Chemical Co. hydrophobic/hydrophilic glycol ethers.

In other embodiments, the solvent is an alcohol selected from methanol, ethanol, propanol, butanol and other alcohols. In further embodiments, the solvent may be acetate such as ethyl acetate, ethylaceto acetate, and others.

In other embodiments, the solvent is selected from terpinol, acetone, ethyl acetate, ethanol, propanol, butanol, and any combination thereof.

The printing formulation may further comprise an additive selected from humectants, binders, surfactants, fungicides, rheology modifiers, wetting agents, pH adjusting agents, and mixtures thereof.

In some embodiments, the formulation comprising the metal complex is free of a dispersing or stabilizing agent.

In some embodiments, the printing formulation of the invention comprises a medium and a combination of:

As stated above, the printing formulation (i.e., ink formulation) comprises a medium and at least one metal precursor selected from:
(1) metal precursor in the form of metal salt nanoparticles dispersed in said medium (as detailed hereinabove); and
(2) metal precursor in the form of a metal complex, as defined herein, dissolved in said medium.

In some embodiments, the combined formulation comprises at least one stabilizer or dispersing agent.

In another aspect, the invention provides a method of forming the printing formulation of the invention, the method comprising:
obtaining a precursor of a metal in a salt or complex form; and
adding said metal precursor into a liquid medium, wherein when the metal precursor is a metal salt nanoparticulate, dispersing the nanoparticles in a liquid medium, and when the metal precursor is a metal complex, dissolving the metal complex in a liquid medium.

In order to reduce the amount (concentration) of the organic stabilizer, the dispersion of metal salts may be further treated by centrifugation, filtration or ultra-filtration. The decrease of the nonvolatile organic content enables to obtain a pattern with high conductivities at lower temperatures.

The method of forming the dispersion of nanoparticles in a liquid medium may additionally comprise the step of preparing a water-in-oil type emulsion. The emulsion may be obtained by homogenizing an aqueous solution of the metal salt in a proper oil phase (which is a liquid that is not miscible with water) and in the presence of proper emulsifiers and or stabilizer. Subsequently, the water phase may be evaporated to obtain a dispersion of the metal salt particles in an oil phase.

The printing formulation, either in the form of a dispersion of metal salt particles or a solution of metal complexes, may be utilized in a printing method for forming a metallic conductive pattern on a surface region of a substrate.

Figure 2:
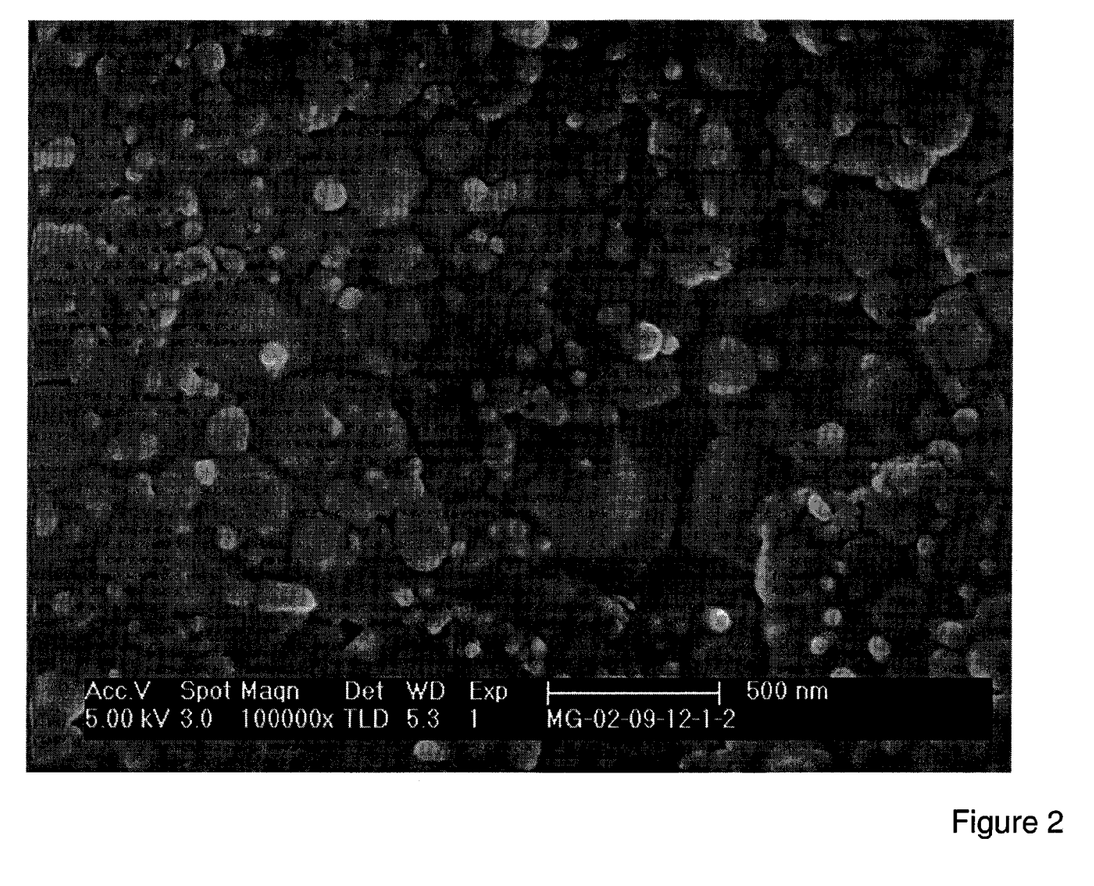
FIG. 2 presents HR-SEM image of the a metallic layer after decomposition of a metal complex ink, in accordance with the present invention, as described in Example 1, formulation 3.

One of the major issues in printing metal-based conductive patterns, e.g., copper patterns, is the stability of the metallic pattern, prior to and after sintering. In the present invention the metal precursor is selected to be resistant to oxidation. The pattern obtained after the decomposition process, as disclosed hereinbelow, is highly stable in air. That is due to the dense packing obtained at the upper surface of the pattern. FIG. 2 presents HR-SEM images of the surface of the obtained pattern after decomposition, demonstrating the unique highly dense packing and the presence of large grains. The presence of large grains in combination with the highly dense surface increased oxidation resistance of the copper surface; even where the upper surface was slightly oxidized, the layer conductance did not change, as described in Example 1, formulation 3, below.

It should be emphasized that the decomposition of the metal precursor particles forming a homogeneous flat surface of large grains is not at all trivial. In previous publications reporting on complex inks the obtained patterns visibly contained nanoparticles and material voids between the particles [6,8]. Obviously, such patterns of the art demonstrating material voids between the nanoparticles, demonstrate lower conductivities and resistance to oxidation. Example 1 formulation 3 provided below demonstrate the high stability against oxidation for the copper based complex inks.

As stated above, the printing formulations of the invention may be used as inks. The ink formulation may be in a liquid medium, or may be formulated as solid inks ("toner"), e.g., such as those used in graphic toners.

The inks are suitable for various coating and printing methods. In some embodiments, the printing formulations of the invention may be used to coat a substrate surface by a method selected from spin coating, roll coating, spray coating, dip coating, flow coating, doctor blade coating, dispensing, ink-jet printing, offset printing, screen printing, pad printing, gravure printing, flexography, stencil printing, imprinting, xerography, lithography, nanoimprinting, stamping and any other deposition method known in the art.

Various additives may be added to the printing formulation, depending on the final application, the method of application and other parameters, the additive may be selected from wetting agents, humactants, rheology modifiers, binders, pH adjusting agents, stabilizers, antioxidants, decomposition enhancers, antioxidants, cosolvents and others.

In another aspect, the invention provides a process for forming a conductive pattern on a surface region of a substrate, the process comprising:
  obtaining a substrate;
  on at least a surface region of a substrate forming a pattern of a printing formulation according to the invention, the formulation comprising at least one metal precursor selected from:
    (1) metal precursor in the form of metal salt nanoparticles dispersed in a medium (as detailed hereinabove); and
    (2) metal precursor in the form of a metal complex, as defined herein, dissolved in a medium;
  decomposing the metal precursor in said pattern to obtain a metallic pattern (i.e., the pattern being substantively compose of metal at the zero oxidation state).

In some embodiments, the process further comprises sintering the metallic pattern; the pattern being conductive.

In accordance with the invention, a low temperature decomposition of the metal precursor is desired, to convert the precursor into a metal. In some embodiments, the metal precursor is thus selected amongst such precursors which decompose at a temperature lower than the melting point of the metal. In some embodiments, the metal precursor is selected to decompose at a temperature lower than 400° C., lower than 300° C., lower than 200° C., or lower than 150° C. The decomposition of the metal precursor may be carried out by heating or any other process which results in the metallic pattern. The heating may be carried out under nitrogen or under a reducing atmosphere. In some embodiments, decomposition is achievable by heating under air.

The conversion from the salt or complex form to the metallic form may similarly be carried out by heating, e.g., in an oven, by laser radiation, by microwave, by electrical voltage, by exposure to light (such as IR, UV, Vis, Xenon); and similarly by photonic curing by UV or IR or by plasma treatment or any other method which enables decomposition to the metallic form.

The decomposition and conversion of the metal precursor into a metal may be carried out also by chemical methods. For example, deposition and contact (by printing or other methods) of a reducing agent or any other chemical that can lead to the formation of the metallic pattern.

The printed layers of metal precursors may be added or combined with other layers, for example metallic particles. This can be achieved either by using an ink formulation that contains both (metallic particles and the insoluble particles or complexes, or the three components) or by printing several materials in a successive process, i.e., printing of the different layers consecutively.

The patterns may be printed on flexible or rigid substrates, a variety of plastics such as Nylon, PET, PEN, polycarbonate, Teslin, PVC and others, paper, glass, metallic surfaces, silicon, germanium, ITO, FTO, $TiO_2$ and others.

The printing formulations of the present invention may be used widely for EMI shielding materials, conductive adhesives, low-resistance metal wirings, PCBs, FPCs, antennas for RFID tags, solar cells, secondary cells or fuel cells and electrodes or wiring materials for TFT-LCDs, OLEDs, flexible displays, OTFTs, sensors and others.

In yet another aspect, the invention provides a conductive pattern obtainable by the above method.

The invention further provides an element comprising a conductive pattern having large grains and dense packing (wherein the dense packing is being substantially free of voids).

In another aspect, the invention provides an element comprising a conductive pattern, wherein said conductive pattern comprises a metallic material being substantially free of metal oxide at the time of manufacture.

In a further aspect, the invention provides an element comprising a conductive pattern, wherein said conductive pattern has high oxidation resistance at ambient atmosphere.

In yet another aspect, the invention provides a printing formulation comprising at least one metal complex having metal to organic ligand ratio of 1, or above 1.

In yet another aspect, the invention provides a printing formulation comprising at least one metal complex, wherein the at least one metal atom being associated to at least two different organic ligands.

In a further aspect, the invention provides a printing formulation comprising at least one metal complex, wherein the at least one metal atom being associate to at least one additive ligand. In some embodiment, the additive ligand may be a conductor (metallic particles or nanoparticles), a metal precursor, an oxidant, an anti-oxidant, a stabilizer, a solvent, a humectant, a dispersing agent, a binder, a reducing agent, a surfactant, a wetting agent and a leveling agent.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

I. Copper Complex Ink Formulation

Formulation 1:

4 g copper formate (.4H$_2$O) were dissolved in 2 g amino methyl propanol (AMP). The mole ratio of copper formate to AMP was 0.8. The formulation was placed on polyethylene terphthalate (PET) film and was heated under nitrogen flow for 10 min at 150° C. A copper like appearance was observed and a sheet resistance of 5 mOhms per square was measured. The sheet resistance was measured again after a week and after a month, and the measured values were found to be, 7 and 10 mOhms per square, respectively.

Formulation 2:

A similar formulation was prepared with another solvent, in which 2.5 g copper formate was dissolved in 2 g butanol and 1.5 g amino methyl propanol (AMP).

Formulation 3:

A similar formulation was prepared with another solvent, in which 2.5 g copper formate was dissolved in 2 g dipropylene glycol methyl ether (DPM) and 1.5 g Amino methyl propanol (AMP). This formulation was placed on a glass slide and was heated under nitrogen flow for 20 min at 130° C. A copper like appearance was observed and a sheet resistance of 20 mOhms per square was measured. The sheet resistance was measured again after a week and after a month, and the measured values were found to be, 28 and 50 mOhms per square, respectively.

Formulation 4:

2.5 g copper formate was dissolved in 2.5 g octanol, 5.5 g butanol and 1.5 g amino methyl propanol (AMP) and a wetting agent (BYK 333). The formulation was inkjet printed by UniJet printer equipped with Samsung Minihead (30 pl).

Formulation 5:

3 g copper formate was dissolved in 2 g butanol and 2 g amino methyl propanol (AMP). The formulation was placed on a glass slide and was heated under nitrogen flow for 20 min at 200° C. A copper like appearance was observed and a sheet resistance of 33 mOhms per square was measured.

Formulation 6:

2 g copper formate was dissolved in 7 g DPM and 1.5 g amino methyl propanol (AMP). That formulation was inkjet printed by UniJet printer equipped with Samsung Minihead (30 pl). The DSC results (not provided) obtained for Formulations 5 and 6 indicated that when a solvent such as butanol (which has a low boiling point) was used, as in Formulation 5, an endothermic peak of the solvent evaporation was observed at 110° C., and an exothermic peak of the copper complex decomposition was observed at 145° C. In the case of a high boiling point solvent, such as TPM, utilized in Formulation 6, these peaks were less clear. However, it was noted that the decomposition (accompanied by an exothermic peak) took place around 140° C., while the solvent evaporated at a much higher temperature of 172° C.

Formulation 7:

1.75 g copper formate was dissolved in 3 g butanol, 5 g triprolylene glycol methyl ether (TPM) and 1 g amino methyl propanol (AMP). The formulation was inkjet printed by UniJet printer equipped with Samsung Minihead (30 pl). The printed patterns were heated to 150° C. for 10 min and the resistance along 2.5 cm lines was measured at 7.8 Ohms, while the sheet resistance measured was 0.156 Ohms per square.

Formulation 8:

Nickel acetate with AMP in DPM-4 g Nickel acetate was dissolved in 2 g DPM and 2 g amino methyl propanol (AMP). The formulation was drawn down on a glass slide and was heated under nitrogen flow for 30 min at 250° C. A shiny grey appearance was observed and a sheet resistance of 1.7 Ohms per square was measured.

Formulation 9:

Nickel acetate with AMP in butanol-4 g Nickel acetate was dissolved in 2 g butanol and 2 g amino methyl propanol (AMP). The formulation was drawn down on a glass slide and was heated under nitrogen flow for 15 min at 250° C. A shiny grey appearance was observed and a sheet resistance of 6.5 Ohms per square was measured.

II. Copper Metal Particles Obtained by Bead Milling

EXAMPLE 1

75 g of copper formate was mixed with 7.5 g of a cationic polymer (MW=2000) and with 67.5 g DPM (Dipropylene glycol methyl ether). The mixture was bead milled (WAB) to obtain copper formate nanoparticles with an average diameter of 290 nm (according to DLS measurements, not shown).

The formulation was drawn down on a glass slide and heated to 200° C. under nitrogen for 20 min. A sheet resistance of 20 mOhms per square was measured. The heating was carried out under reducing atmosphere. In several alternatives, the reducing atmosphere contained hydrogen, formic acid or other carboxylic acids.

EXAMPLE 2

75 g of copper formate was mixed with 7.5 g of an ammonium salt of a co-polymer with acidic goups, 67.5 g DPM (dipropylene glycol methyl ether). The mixture was bead milled (WAB) by using 0.35 mm beads to obtain copper formate nanoparticles with an average diameter of 568 nm (according to DLS measurements, not shown).

EXAMPLE 3

Copper Particles Obtained by Bead Milling with 0.1 mm Beads

The particles obtained in Example 2 were further milled using 0.1 mm beads. The particle size decreased to 115 nm

EXAMPLE 4

75 g of Nickel formate were mixed with 7.5 g of a cationic polymer (MW=2000) with 67.5 g DPM (Dipropylene glycol methyl ether). Then, the mixture was bead milled (WAB) to obtain nickel formate nanoparticles.

EXAMPLE 5

Mixture of Copper and Nickel Precursor Particles Obtained by Bead Milling 37.5 g of Nickel formate and 37.5 g of copper formate were mixed with 7.5 g of a cationic polymer (MW=2000) with 67.5 g DPM (Dipropylene glycol methyl ether). Then the mixture was bead milled (WAB) to obtain copper and nickel formate NPs.

EXAMPLE 6

Silver Lactate Particles Obtained by Bead Milling

Silver lactate was milled with a stabilizing polymer with and DPM (Dipropylene glycol methyl ether). The formulation was drawn down on a glass slide and heated to 170° C. for 5 min in air. A sheet resistance of 6 Ohms per square was measured.

EXAMPLE 7

Silver Oxalate Particles Obtained by Bead Milling

Silver oxalate was milled with a stabilizing polymer with and DPM (Dipropylene glycol methyl ether). The formulation was drawn down on a glass slide and heated to 150° C. A sheet resistance of 0.2 Ohms per square was measured.

EXAMPLE 8

Washing of Copper Formate Particles by Centrifugation

The particles obtained in Example 2 were washed by centrifugation at 4000 RPM for 25 min, then the supernatant was decanted and the centrifugation was repeated again. The obtained dispersion was drawn down on a glass slide and was heated under nitrogen to 200° C. for 30 min. The obtained layer showed a sheet resistance of 0.5 ohms/square.

EXAMPLE 9

Copper precursor as Particles Obtained by Precipitation 2 g of copper carbonate were mixed with an polymeric stabilizer in DPM in a hot bath (95 deg C). Then 4 ml of formic acid were added and after a few seconds a gas was released ($CO_2$) from the reactor accompanied by a color change of the dispersion from green to blue, indicating the formation of copper formate.

III. Copper Metal Particles Obtained by Precipitation

EXAMPLE 1

Copper precursor Particles Obtained by Precipitation 1 ml of 10 wt % copper formate aqueous solution was injected to 5 ml acetone with 0.1 g of a polymeric stabilizer while stirring at room temperature. After a few minutes the stirring was stopped and copper formate nanoparticles with an average diameter of 700 nm (according to DLS measurements) were obtained.

EXAMPLE 2

Copper precursor Particles Obtained by Emulsion-solvent Evaporation

An emulsion was formed by homogenizing 10.25 g cyclometicone and 2.25 g Abil EM90 with 12.5 g aqueous solution of 10 wt % copper formate. After evaporation of the water from the emulsion by a rotor evaporator, a dispersion of copper formate nanoparticles with a diameter of 236 nm (according to DLS measurements) was obtained.

The invention claimed is:

1. A printing formulation consisting of
  at least one metal precursor in the form of metal salt nanoparticles dispersed in a medium; and
  optionally at least one printing carrier,
  wherein metal salt nanoparticles consist of metal and an organic and/or inorganic anion.

2. The printing formulation of claim 1, wherein said metal of the metal salt nanoparticles is a metal of Groups IIIB, IVB, VB, VIB, VIIB, VIIIB, IB and IIB of block d of the Periodic Table of Elements.

3. The printing formulation of claim 1, wherein said metal of the metal salt nanoparticles is a metal selected from the group consisting of Sc, Ti, V, Cr, Mn, Fe, Ni, Cu, Zn, Y, Zr, Nb, Tc, Ru, Mo, Rh, W, Au, Pt, Pd, Ag, Co, Cd, Hf, Ta, Re, Os, Al, Sn, In, Ga, and Ir.

4. The printing formulation of claim 3, wherein said metal is selected from the group consisting of Cu, Ni, and Ag.

5. The printing formulation of claim 3, wherein said metal is Cu.

6. The printing formulation of claim 1, wherein said organic anion is selected from the group consisting of acetate ($CH_3COO-$), formate ($HCOO-$), citrate ($C_3H_5O(COO)_3-$), acetylacetonate, lactate ($CH_3CH(OH)COO-$), oxalate (($COO)_2-$), and any derivative thereof.

7. The printing formulation of claim 3, wherein the metal salt nanoparticles are a copper metal salt selected from the group consisting of copper formate, copper citrate, copper acetate, copper nitrate, copper acetylacetonate, copper perchlorate, copper chloride, copper sulfate, copper carbonate, copper hydroxide, and mixtures thereof.

8. The printing formulation of claim 3, wherein the metal salt nanoparticles are a nickel metal salt selected from the group consisting of nickel formate, nickel citrate, nickel acetate, nickel nitrate, nickel acetylacetonate, nickel perchlorate, nickel chloride, nickel sulfate, nickel carbonate, nickel hydroxide, and mixtures thereof.

9. The printing formulation of claim 1, wherein the metal salt nanoparticles are a metal salt selected from the group consisting of indium(III) acetate, iron(II) acetate, gallium (III) acetylacetonate, aluminum(III) stearate, zinc chloride, tin(II) acetylacetonate, tin(II) acetate, lead(II) acetate, and lead(II) acetlylacetonate.

10. The printing formulation of claim 1, wherein the medium is a liquid medium.

11. The printing formulation according to claim 1, wherein the at least one metal precursor is a copper salt.

12. An ink formulation comprising the printing formulation of claim 1.

13. A process for forming a conductive metallic pattern on a surface region of a substrate, the process comprising:
on at least the surface region of the substrate forming a pattern with the printing formulation of claim 1;
decomposing said at least one metal precursor in said pattern to obtain the conductive metallic pattern.

14. The process of claim 13, further comprising the step of sintering the metallic pattern.

15. The process of claim 13, wherein said step of decomposing is achievable by heating, wherein said heating is selected from the group consisting of heating in an oven, heating by laser, heating by microwave, heating by electrical voltage, and heating by exposure to light.

16. A conductive pattern obtained by the process of claim 13.

17. The conductive pattern according to claim 16, wherein the conductive pattern comprises copper.

18. A printing formulation consisting of:
a medium;
metal precursor; and
optionally at least one printing carrier;
wherein said metal precursor is dispersed in the medium;
wherein said metal precursor consists of metal salt nanoparticles;
wherein said metal salt nanoparticles consist of metal and an organic anion selected from the group consisting of acetate (CH3COO—), formate (HCOO—), citrate (C3H5O(COO)3-), acetylacetonate, lactate (CH3CH (OH)COO—), oxalate ((COO2-), and an derivative thereof; and wherein said metal of the metal salt nanoparticles is selected from the group consisting of Ni, Cu and Ag.

19. A printing formulation consisting of:
a medium;
metal precursor; and
optionally at least one printing carrier;
wherein said metal precursor is dispersed in the medium;
wherein said metal precursor consists of metal salt nanoparticles; and
wherein said metal salt nanoparticles consist of a member selected from the group consisting of:
copper formate,
nickel formate,
silver lactate,
silver oxalate, and
a mixture of copper formate and nickel formate.

20. A process for forming a conductive metallic pattern on a surface region of a substrate, the process comprising:
on at least the surface region of the substrate forming a pattern with the printing formulation of claim 19;
decomposing said metal precursor in said pattern to obtain the conductive metallic pattern.

* * * * *

UNITED STATES PATENT AND TRADEMARK OFFICE
CERTIFICATE OF CORRECTION

PATENT NO. : 10,590,295 B2
APPLICATION NO. : 14/382110
DATED : March 17, 2020
INVENTOR(S) : Michael Grouchko and Shlomo Magdassi It is certified that error appears in the above-identified patent and that said Letters Patent is hereby corrected as shown below:

In the Claims

Claim 6, Column 14, Lines 51-53:
"acetate (CH3COO-), formate (HCOO-), citrate (C3H5O(COO)3-), acetylacetonate, lactate (CH3CH(OH)COO-), oxalate ((COO)2-), and any derivative thereof."

Should be deleted and replaced with:
-- acetate ($CH_3COO^-$), formate ($HCOO^-$), citrate ($C_3H_5O(COO^-)_3$), acetylacetonate, lactate ($CH_3CH(OH)COO^-$), oxalate (($COO^-)_2$), and any derivative thereof. --

Claim 18, Column 16, Lines 5-8:
"an organic anion selected from the group consisting of acetate (CH3COO-), formate (HCOO-), citrate (C3H5O(COO)3-), acetylacetonate, lactate (CH3CH(OH)COO-), oxalate ((COO2-), and an derivative"

Should be deleted and replaced with:
-- an organic anion selected from the group consisting of acetate ($CH_3COO^-$), formate ($HCOO^-$), citrate ($C_3H_5O(COO^-)_3$), acetylacetonate, lactate ($CH_3CH(OH)COO^-$), oxalate (($COO^-)_2$), and any derivative --

Signed and Sealed this
Twenty-second Day of September, 2020

Andrei Iancu
*Director of the United States Patent and Trademark Office*